United States Patent
Lin et al.

(10) Patent No.: US 11,431,353 B1
(45) Date of Patent: Aug. 30, 2022

(54) ENCODING METHOD, ELECTRONIC DEVICE, AND PROGRAM PRODUCT

(71) Applicant: EMC IP Holding Company LLC, Hopkinton, MA (US)

(72) Inventors: Zhenzhen Lin, Shanghai (CN); Si Chen, Shanghai (CN); Anzhou Hou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 17/322,303

(22) Filed: May 17, 2021

(30) Foreign Application Priority Data

Apr. 23, 2021 (CN) .......................... 202110443383.X

(51) Int. Cl.
- *H03M 13/00* (2006.01)
- *H03M 13/15* (2006.01)
- *G06F 11/10* (2006.01)
- *H04L 67/1097* (2022.01)

(52) U.S. Cl.
CPC ....... *H03M 13/154* (2013.01); *G06F 11/1076* (2013.01); *H04L 67/1097* (2013.01)

(58) Field of Classification Search
CPC .............. H03M 13/154; G06F 11/1076; H04L 67/1097
See application file for complete search history.

(56) References Cited

U.S. PATENT DOCUMENTS

| | | | | |
|---|---|---|---|---|
| 2005/0015246 A1* | 1/2005 | Thumpudi | ............... | G10L 19/24 704/E19.044 |
| 2005/0015259 A1* | 1/2005 | Thumpudi | .............. | G10L 19/24 704/E19.044 |
| 2005/0273791 A1* | 12/2005 | Evans | ................... | G06F 3/0481 719/328 |
| 2008/0022191 A1* | 1/2008 | Stolpman | ............ | H03M 13/353 714/776 |
| 2008/0107185 A1* | 5/2008 | Lefol | ................... | H04N 19/103 375/E7.176 |
| 2011/0113282 A1* | 5/2011 | De Spiegeleer | .... | G06F 11/1076 714/6.13 |
| 2012/0296656 A1* | 11/2012 | Smyth | .................. | H03M 13/35 704/E21.001 |
| 2013/0246876 A1* | 9/2013 | Manssour | ............. | H04L 1/0041 714/751 |
| 2016/0316220 A1* | 10/2016 | Zhao | ....................... | H04N 19/56 |
| 2018/0039438 A1* | 2/2018 | Dupaquis | ............ | G06F 12/1441 |
| 2019/0028741 A1* | 1/2019 | Davies | ............... | H04N 21/6379 |

(Continued)

OTHER PUBLICATIONS

"IEEE Standard for an Architectural Framework for the Internet of Things (IoT)," in IEEE Std 2413-2019 , vol., no., pp. 1-269, Mar. 10, 2020, doi: 10.1109/IEEESTD.2020.9032420. (Year: 2020).*

(Continued)

*Primary Examiner* — Daniel F. McMahon
(74) *Attorney, Agent, or Firm* — Ryan, Mason & Lewis, LLP

(57) ABSTRACT

An encoding method includes: receiving configuration data related to encoding with a predetermined encoding mode; determining an encoding strategy based on the configuration data, wherein the encoding strategy includes parameters associated with encoding the data on an entity; and causing the data to be encoded on the entity based on the encoding strategy.

20 Claims, 4 Drawing Sheets

(56) References Cited

U.S. PATENT DOCUMENTS

2019/0075319 A1\* 3/2019 Gaedke ............... H04N 19/176
2019/0173657 A1\* 6/2019 Tomasi ............... H03M 13/353

OTHER PUBLICATIONS

R. Guo, L. Wang, J. Liu and W. Wu, "Stereo Video Communication Based on Unequal Error Protection Scheme of LDPC Code," 2008 4th International Conference on Wireless Communications, Networking and Mobile Computing, 2008, pp. 1-4, doi: 10.1109/WiCom.2008.774. (Year: 2008).\*
Wikipedia, "Erasure Code," https://en.wikipedia.org/wiki/Erasure_code, Apr. 21, 2020, 5 pages.

\* cited by examiner

ENCODING METHOD, ELECTRONIC DEVICE, AND PROGRAM PRODUCT

RELATED APPLICATION(S)

The present application claims priority to Chinese Patent Application No. 202110443383.X, filed Apr. 23, 2021, and entitled "Encoding Method, Electronic Device, and Program Product," which is incorporated by reference herein in its entirety.

FIELD

Embodiments of the present disclosure generally relate to computer technologies, in particular to an encoding method, an electronic device, and a computer program product that can be used in fields such as data processing and data protection.

BACKGROUND

Modern distributed storage systems have an integrated erasure code technology to achieve data protection. The erasure code technology divides data into a plurality of segments, uses redundant data segments to expand and encode the data, and stores them in a set of different locations or storage media. Although implementation modes of distributed storage systems vary, generally speaking, these distributed storage systems set rules associated with the use of erasure codes to protect data based on the unit of logical partition.

In a dynamic and resource-limited edge network environment, the erasure code technology also plays an important role in edge storage systems because it can achieve a balance between storage and computing overhead in the storage systems. However, storage systems in a traditional technology cannot meet various requirements for efficient use of the erasure code technology, and especially cannot meet the requirements for efficient use of the erasure code technology in edge network solutions. For example, data generated by many users needs to be configured with erasure codes based on specific attributes of the data, rather than using fixed databases such as directories. In addition, the scarcity of computing and storage resources on edge nodes also requires more flexible erasure code strategies while maintaining data reliability.

SUMMARY

Illustrative embodiments of the present disclosure provide an encoding method, an electronic device, and a computer program product.

In a first aspect of the present disclosure, an encoding method is provided. The method includes: receiving configuration data related to encoding with a predetermined encoding mode; determining an encoding strategy based on the configuration data, wherein the encoding strategy includes parameters associated with encoding the data on an entity; and causing the data to be encoded on the entity based on the encoding strategy.

In a second aspect of the present disclosure, an electronic device is provided. The electronic device includes: at least one processing unit; and at least one memory, coupled to the at least one processing unit and storing instructions for being executed by the at least one processing unit, wherein the instructions, when executed by the at least one processing unit, cause the device to execute actions including: receiving configuration data related to encoding with a predetermined encoding mode; determining an encoding strategy based on the configuration data, wherein the encoding strategy includes parameters associated with encoding the data on an entity; and causing the data to be encoded on the entity based on the encoding strategy.

In a third aspect of the present disclosure, a computer program product is provided. The computer program product is tangibly stored on a non-transitory computer-readable medium and includes machine-executable instructions. The machine-executable instructions, when executed, cause a machine to execute any step of the method described according to the first aspect of the present disclosure.

This Summary is provided to introduce the selection of concepts in a simplified form, which will be further described in the Detailed Description below. The Summary is not intended to identify key features or essential features of the embodiments of the present disclosure, nor is it intended to limit the scope of the embodiments of the present disclosure.

BRIEF DESCRIPTION OF THE DRAWINGS

The above and other objectives, features, and advantages of the present disclosure will become more apparent from the following description of example embodiments of the present disclosure, to be viewed with reference to the accompanying drawings. In the example embodiments of the present disclosure, the same reference numerals generally represent the same parts.

The same or corresponding reference numerals in the various drawings represent the same or corresponding portions.

DETAILED DESCRIPTION

Figure 1:
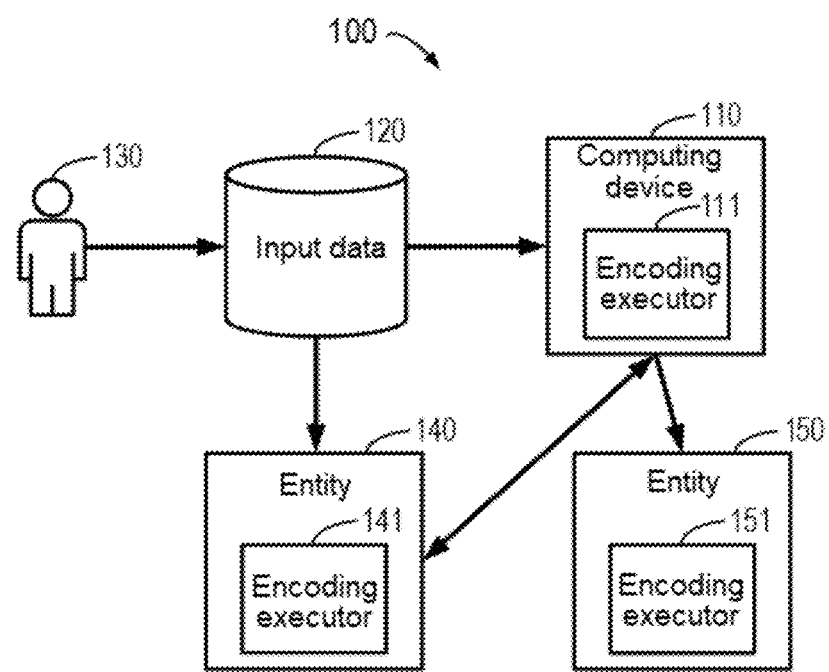
FIG. 1 illustrates a schematic diagram of encoding environment 100 in which a device and/or a method according to the embodiments of the present disclosure may be implemented.

Hereinafter, illustrative embodiments of the present disclosure will be described in more detail with reference to the accompanying drawings. Although illustrative embodiments of the present disclosure are shown in the accompanying drawings, it should be understood that the present disclosure can be implemented in various forms and should not be limited by the embodiments set forth herein. Rather, these embodiments are provided to make the present disclosure more thorough and complete and to fully convey the scope of the present disclosure to those skilled in the art.

As used herein, the term "include" and variations thereof mean open-ended inclusion, for example, "including but not limited to." Unless specifically stated, the term "or" means "and/or." The term "based on" means "based at least in part on." The terms "an example embodiment" and "an embodiment" mean "at least one embodiment." The term "another embodiment" indicates "at least one additional embodiment." The terms "first," "second," and the like may refer to different or identical objects. Other explicit and implicit definitions may also be included below.

For example, an encoding technology such as an erasure code technology is an effective method for data protection in a storage system. In implementation of the erasure code technology, data is broken down into fragments, expanded and encoded with redundant data segments, and then stored in a set of different locations or storage media.

Although the data can be replicated for the purpose of protecting the data, modern distributed storage systems have integrated an implementation mode of the erasure code technology into various systems. For example, a Hadoop distributed file system can support the erasure code technologies such as RS erasure code algorithm and XOR erasure code algorithm based on directories, while a Ceph distributed file system can statically support RS, Cauchy, and other erasure code technologies based on logical partition of objects.

The erasure code technology is also very important in an edge network architecture. In the edge network architecture, edge nodes with storage and computing functions control end users within their range and communicate with cloud services at the same time. In fact, due to the deployment scale of the edge nodes, hardware functions, and different functions related to management and communication between systems, the edge nodes can be divided into a plurality of layers. The data generated by the end users will be uploaded to an edge or a cloud for storage and query, but some edge devices that store the data are in a less restrictive environment, which brings higher data unavailability compared with traditional distributed storage systems. Data replication may be a solution to this situation, but the limited storage capacity of the nodes in the edge network structure limits the utilization rate of data replication. Therefore, generally recognized erasure codes, as a balance between storage and computing overhead in storage systems, are essential for data protection in edge scenarios.

However, a current distributed storage system mainly relies on system administrators to configure data protection strategies. Therefore, from the perspective of edge infrastructure and customers, it is difficult to dynamically meet various requirements.

For example, in the current distributed storage system, the erasure code algorithm is statically configured, so it cannot be conveniently changed at runtime. For example, in the Hadoop distributed file system, management commands are provided to first add an erasure code strategy based on an xml file, and then set the required erasure code strategy into a certain directory. If the erasure code strategy changes due to some service logic, a programmer must manipulate these management commands in a source code, and the privilege may not be granted in the system design of each application. This becomes an obstacle when developing distributed applications, especially in hyper-scale environments.

For another example, in the current distributed storage system, the erasure code strategy is set based on directories or pools. For use cases in an edge solution, this is not very detailed. In this kind of highly dynamic environment, data stored in a logical unit may have various data protection requirements. There may be data generated from different sensors or data from various third parties, which are used for the same big data processing purpose and have the multiple erasure code strategies. In addition, it is sometimes necessary to divide some data from the same source into hot data and cold data directories. These data directories have formulated strategies from the perspective of data acquisition efficiency, but all these extreme cases add to the conflict between existing erasure code configuration methods and user needs.

For another example, in current distributed storage systems, since current distributed storage systems are deployed in relatively homogeneous and stable hardware, they do not consider many factors related to the limitation of hardware resources. But in the edge architecture, nodes that make up a cluster are highly heterogeneous in terms of computing and storage capabilities, and their health state is unstable due to a low-restricted environment. In this case, new challenges will arise for automatically adjusting the erasure code strategy to protect the data as much as possible.

In order to at least partially solve one or more of the above problems and other potential problems, the embodiments of the present disclosure provide an encoding method. The method provides a user-oriented erasure coding solution on the basis of an edge network so as to solve the outstanding problem. It should be pointed out that the method is not limited to the edge network, but can also be applied to a data center or a cloud environment. By using the encoding method according to an embodiment of the present disclosure, higher flexibility and reliability can be provided when encoding the data, so it is especially suitable for the field of data protection, and the user's data can be encoded and protected by using lower overhead to improve user experience for users with data encoding and data protection needs.

FIG. 1 illustrates a schematic block diagram of encoding environment 100 in which an encoding method in some embodiments of the present disclosure may be implemented. According to an embodiment of the present disclosure, encoding environment 100 may be a cloud environment.

As shown in FIG. 1, encoding environment 100 includes user 130 and input data 120, wherein an arrow pointing from user 130 to input data 120 indicates that input data 120 is provided by user 130. According to an embodiment of the present disclosure, input data 120 may include, for example, configuration data related to encoding data with a predetermined encoding mode such as an erasure code.

Encoding environment 100 also includes computing device 110, entity 140, and entity 150. Computing device 110 may also be considered as another entity, and computing device 110, entity 140, and entity 150 respectively include encoding executor 111, encoding executor 141, and encoding executor 151. It should be understood that two entities 140 and 150 included in encoding environment 100 are only for example, and the protection scope of the embodiments of the present disclosure is not limited thereto. In fact, a large number of entities may be included in encoding environment 100. As shown in FIG. 1, the arrows pointing from input data 120 respectively to computing device 110 and entity 140 indicate that input data 120 can be provided to computing device 110 and entity 140, and a two-way arrow between entity 140 and computing device 110 indicates that entity 140 may provide obtained input data 120 to computing device 110, and computing device 110 may send data such as an encoding strategy to entity 140. At the same time, an arrow pointing from computing device 110 to entity 150 indicates that computing device 110 can send the data such as the encoding strategy to entity 150.

According to an embodiment of the present disclosure, input data 120 may also include to-be-encoded data. At this time, entity 140 may provide the obtained to-be-encoded data to computing device 110, and computing device 110 may provide the to-be-encoded data obtained directly or through entity 140 to entity 150.

According to an embodiment of the present disclosure, since computing device 110, entity 140, and entity 150 respectively include encoding executor 111, encoding executor 141, and encoding executor 151, encoding of the to-be-encoded data can be executed on at least one of computing device 110, entity 140, and entity 150 by at least one of encoding executor 111, encoding executor 141, and encoding executor 151.

According to an embodiment of the present disclosure, the to-be-encoded data may not be provided by user 130, but may have been pre-stored in computing device 110, entity 140, entity 150, or other storage locations in encoding environment 100. At this time, when the to-be-encoded data needs to be encoded by at least one of encoding executor 111, encoding executor 141, and encoding executor 151 on at least one of computing device 110, entity 140, and entity 150, at least one of computing device 110, entity 140, and entity 150 that will perform encoding directly encodes the to-be-encoded data stored on itself, or obtains the to-be-encoded data from other storage locations for encoding.

According to an embodiment of the present disclosure, when computing device 110 receives the configuration data related to encoding the data with the predetermined encoding mode such as erasure code, it may use a strategy engine (not shown) included therein to determine an encoding strategy based on the configuration data. In addition, computing device 110 may further include a health state information monitor (not shown) to obtain health states of computing device 110, entity 140, and entity 150, so that the encoding strategy can be further determined based on the health states.

According to an embodiment of the present disclosure, the difference between computing device 110 and entity 140 as well as entity 150 may lie in that only computing device 110 has the capability to determine an encoding strategy and obtain a health state. However, based on the design of different edge storage systems or the size of data in the architecture, entity 140 and entity 150 may also have the above capabilities, so that if an end user generates a large amount of data, each of entity 140 and entity 150 that can be connected by the end user can actually act as the computing device, thereby reducing the data storage and erasure code calculation burden of the system.

In encoding environment 100 shown in FIG. 1, data interaction among user 130, computing device 110, entity 140, entity 150, and other components that may exist in computing environment 100 may be performed through a network. Further, in an embodiment of the present disclosure, the description is given by taking computing device 110 as an example, and computing device 110 may include any physical or virtual central processing unit, dedicated processing unit, proprietary accelerator, and the like. However, the protection scope of the present disclosure is not limited thereto, but may be applied to various computing elements, units, modules, or systems that can provide input and output processing capabilities.

It should be understood that encoding environment 100 is only illustrative and not restrictive, and it is extensible or reducible. For example, encoding environment 100 may include more users 130, more input data 120 provided by the more users, more computing devices 110, and more entities, so that the requirement that the more users simultaneously use more computing devices 110 and the more entities to process more input data 120 simultaneously or non-simultaneously can be met.

Figure 2:
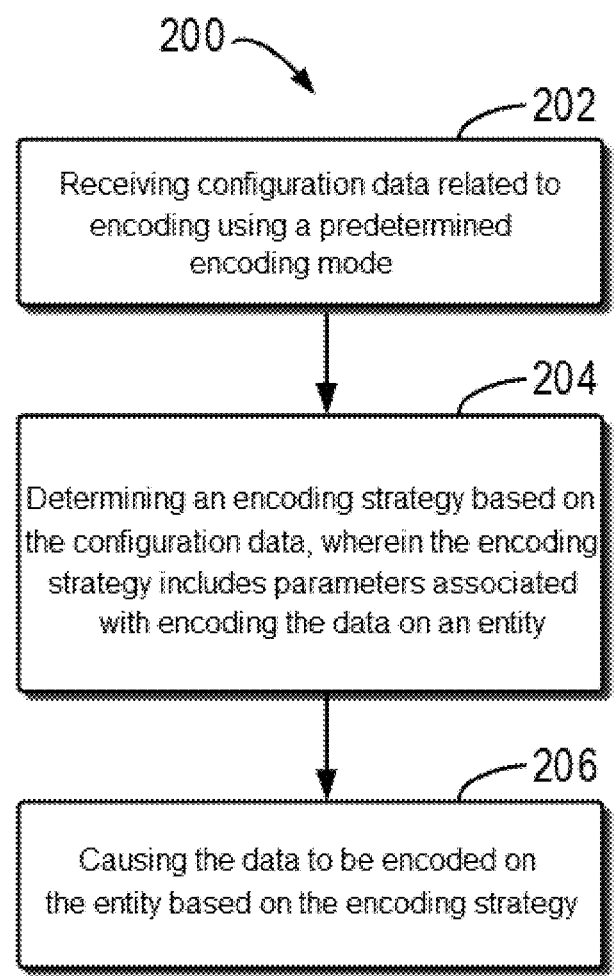
FIG. 2 illustrates a flow chart of encoding method 200 according to an embodiment of the present disclosure.
Figure 3:
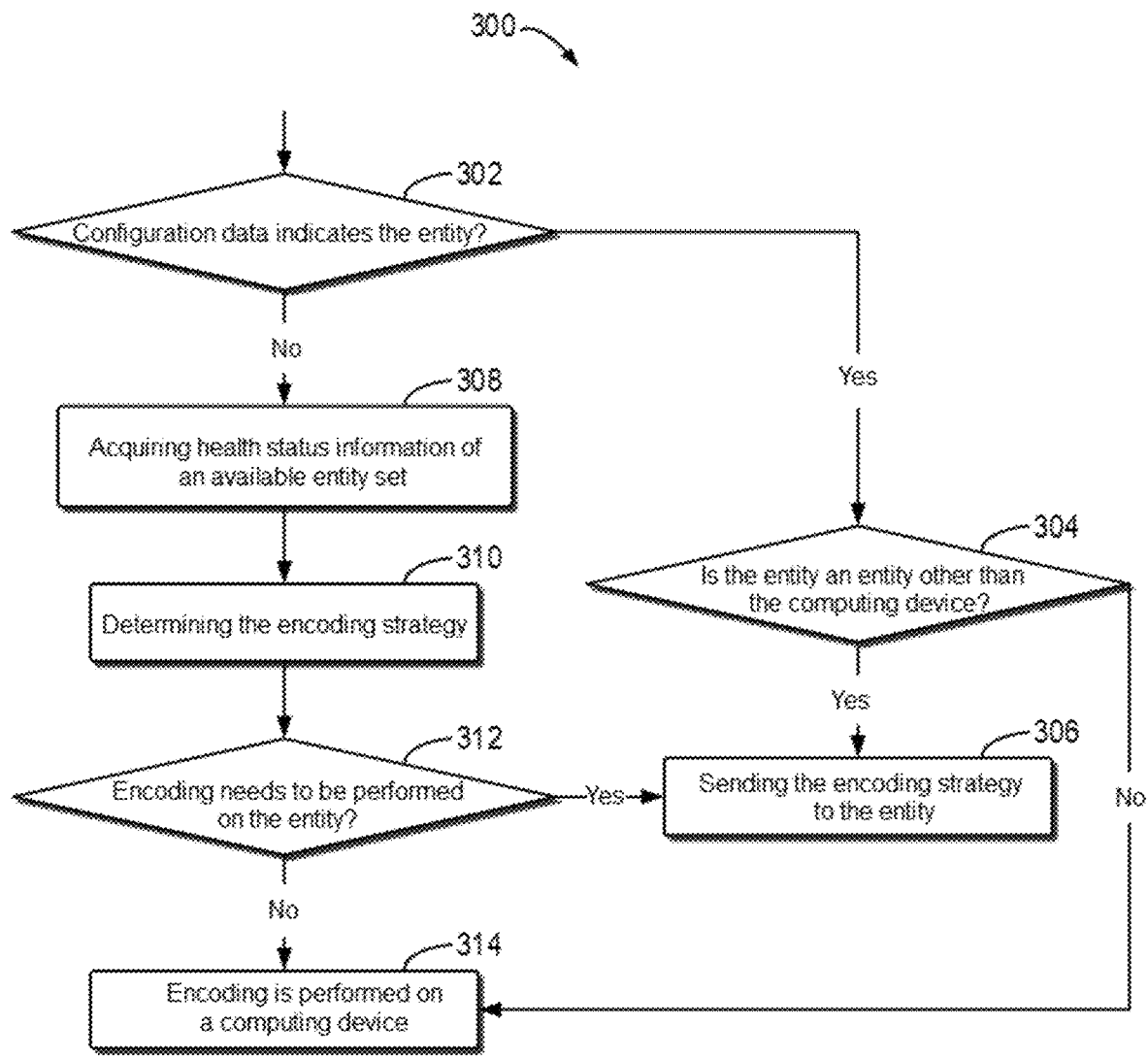
FIG. 3 illustrates a flow chart of encoding method 300 according to an embodiment of the present disclosure.

Encoding method 200 and encoding method 300 shown in respective FIGS. 2 and 3 are illustrated below by taking computing device 110 and input data 120 included in FIG. 1 as an example.

FIG. 2 illustrates a flow chart of encoding method 200 according to an embodiment of the present disclosure. Method 200 may be implemented by computing device 110 shown in FIG. 1 or by other appropriate devices. It should be understood that encoding method 200 may also include additional steps that are not shown and/or may omit the shown steps, and the scope of the embodiments of the present disclosure is not limited in this aspect.

In block 202, computing device 110 receives configuration data included in input data 120 and related to encoding with a predetermined encoding mode. According to an embodiment of the present disclosure, the predetermined encoding mode indicates that an erasure code is adopted for encoding.

According to an embodiment of the present disclosure, the configuration data may be static configuration data or dynamic configuration data. The static configuration data may indicate information related to data blocks and check blocks to be encoded with the predetermined encoding mode, and indicate an entity. Specifically, the static configuration data may indicate on which entities the encoding will be executed, for example, the encoding of the data will be performed on which one or ones of computing device 110, entity 140, and entity 150 shown in FIG. 1. In addition, the static data further directly indicates information related to the data blocks and the check blocks to be encoded with the predetermined encoding mode, such as for the numbers of the data blocks and check blocks to be encoded with the predetermined encoding mode. In addition, the static configuration data can further indicate the type of encoding to be used and the type of to-be-encoded data, so that it can be directly known from the static encoding data which types of data is encoded on which entities and in which encoding mode. Therefore, the static configuration data can be applicable to user key data with strict erasure code requirements, so that an encoding system can always ensure that it meets the requirements.

The dynamic configuration data can indicate a priority of data protection, a ratio associated with the number of the data blocks and the number of the check blocks, and restrictions, such as operating temperature, on the entity on which the data will be encoded, so that the encoding strategy can be dynamically determined based on these guiding data, for example, the numbers of the data blocks and the check blocks to be encoded with the predetermined encoding mode. Therefore, the dynamic configuration data can be applied to, for example, a large data set for artificial intelligence training, and can support infrastructure providers to charge users different fees according to users' configurations, similar to a "pay-as-you-go" method in cloud services. This allows the users to decide their own configuration strategies based on service needs.

In block 204, computing device 110 determines the encoding strategy based on the configuration data received in block 202. According to an embodiment of the present disclosure, the encoding strategy includes parameters associated with encoding the data on the entity, and these parameters may indicate at least one of the following: a source of the data, a type of the data, a protection priority of the data, the number of the data blocks to be encoded with the predetermined encoding mode, the number of the check blocks to be encoded with the predetermined encoding mode, a ratio associated with the number of the data blocks and the number of the check blocks, a type of encoding, and the entity on which data encoding will be performed.

According to an embodiment of the present disclosure, as described above, when the configuration data is the static configuration data, computing device 110 may, for example, take a form of direct reading to read the parameters associated with data encoding on the entity from the static configuration data and form the corresponding encoding strategy. When the configuration data is the dynamic configuration data, computing device 110 may dynamically determine the encoding strategy based on the guidance of the dynamic configuration data. The determination of the encoding strategy based on the configuration data may be specifically implemented by a strategy engine included in computing device 110.

According to an embodiment of the present disclosure, determining the encoding strategy by computing device 110 based on the configuration data may further include that computing device 110 obtains the health state information of an entity set available for encoding the data, for example, through a health state information monitor included therein, and then determines the encoding strategy based on the configuration data and the health state information. The entity set available for encoding the data thereon may include computing device 110 itself and other entities, such as entity 140 and entity 150 as shown in FIG. 1.

According to an embodiment of the present disclosure, the health state information, obtained by computing device 110, of the entity set configured to encode the data thereon may indicate at least one of the following: environmental information of an available entity, such as the surrounding temperature and humidity of the entity, which may affect the service life and the failure rate of the entity; a health state associated with a computing unit in the available entity, such as the remaining service life and failure probability; a health state associated with a storage unit in the available entity, such as the remaining service life, whether there are bad sectors, and the failure possibility; a utilization rate of the computing unit in the available entity; and a utilization rate of the storage unit in the available entity.

According to an embodiment of the present disclosure, after obtaining the health state information of the entity set, computing device 110 may use entities with higher health degree to execute the encoding operation by determining the encoding strategy as much as possible.

According to an embodiment of the present disclosure, in order to avoid the continuous change of the strategy due to the oscillation of state data, after collecting the health state information about, for example, the computing unit, a memory, the storage capacity, or other hardware of a central processing unit, computing device 110 may use a filtering or smoothing algorithm to process the health state information, and then determines the encoding strategy based on the configuration data and the health state information.

According to an embodiment of the present disclosure, when determining the encoding strategy, the computing device may use various different algorithms, such as the algorithm shown in the following formula (1).

$$\text{Erasure code complexity} = \frac{\text{available storage space} * \text{protection ratio}}{\text{hardware workload} * \text{value of data priority}} \quad (1)$$

In the formula (1), a protection ratio may refer to the ratio associated with the number of the data blocks and the number of the check blocks. The formula (1) is aimed at the highly dynamic and heterogeneous attribute of an edge network structure, and the erasure code complexity finally determined according to the formula (1) is proportional to an available storage space and the protection ratio, and is inversely proportional to a workload of the entity set and the data priority set by the user. When determining the encoding strategy, it may specify that the erasure code complexity has an upper threshold, so that various parameters in the formula can be adjusted to prevent the erasure code complexity from exceeding the upper threshold, thereby avoiding excessive consumption of system resources.

According to an embodiment of the present disclosure, when input data 120 is first provided to entity 140, if computing resources of computing device 110 are too limited to meet the encoding requirements, or it is very necessary to ensure the availability of data when input data 120 is provided to entity 140, the computing device 110 may instruct the encoding executor in entity 140 to encode the to-be-encoded data, which may be referred to as an online erasure code solution. Otherwise, the to-be-encoded data can be encoded by computing device 110, which can be referred to as an offline erasure code solution. In addition, when determining the encoding strategy, erasure codes or other factors in the strategy algorithm can further be considered, such as placement of the check blocks based on the state of the entities in the entity set, and whether it can be easily extended according to industrial scenarios or not.

In block 206, computing device 110 causes the data to be encoded based on the encoding strategy on the entity on which data encoding is to be performed as indicated by the encoding strategy. According to an embodiment of the present disclosure, when the encoding strategy indicates that the entity on which data encoding is to be performed is an entity other than computing device 110, for example, entity 140 or entity 150, computing device 110 may send the encoding strategy to the entity on which data encoding is to be performed, so that the entity receiving the encoding strategy can use the included encoding executor to encode the to-be-encoded data. In addition, when the to-be-encoded data indicated by the encoding strategy is not stored on the entity on which data encoding is to be performed, computing device 110 may send an instruction to instruct the entity to receive the to-be-encoded data from user 130 or read the to-be-encoded data from other data storage positions, so that the entity obtains the to-be-encoded data.

According to an embodiment of the present disclosure, after computing device 110 determines the encoding strategy based on the configuration data or causes the data to be encoded on the entity on which data encoding is to be performed based on the encoding strategy, computing device 110 may store the parameters in the form of metadata, so that subsequent operations such as queries can be performed on the encoded data. For example, when a user needs to query certain data later, computing device 110 may first find the metadata corresponding to the data, and then find the location of each data block from a hash value of the metadata. If reading of some data blocks fails, computing device 110 can use the corresponding erasure code strategy and check blocks to perform erasure code decoding and correction methods, so that the system can recover data from the dynamic edge network environment.

FIG. 3 illustrates a flow chart of encoding method 300 according to an embodiment of the present disclosure. Method 300 may be implemented by computing device 110 shown in FIG. 1, especially the strategy engine included in computing device 110, or by other appropriate devices. Encoding method 300 may be a specific description of encoding method 200, and may include additional steps that are not shown and/or may omit the shown steps, and the scope of the embodiments of the present disclosure is not limited in this aspect.

In block 302, computing device 110 determines whether the configuration data indicates the entity on which data encoding is to be performed. If the configuration data indicates the entity on which data encoding is to be performed, method 300 proceeds to block 304, otherwise, method 300 proceeds to block 308.

In block 304, computing device 110 determines whether the entity, on which data encoding is to be performed as indicated in the configuration data, is an entity other than computing device 110, such as entity 140 or entity 150 shown in FIG. 1. If the entity on which data encoding is to be performed is the entity other than computing device 110, then method 300 proceeds to block 306, otherwise, method 300 proceeds to block 314.

In block 306, computing device 110 sends the encoding strategy to the entity on which data encoding is to be performed, so that the entity on which data encoding is to be performed encodes the to-be-encoded data based on the encoding strategy.

In block 308, computing device 110 obtains the health state information of the entity set available for encoding the data thereon, for example, through a health state information monitor included therein.

In block 310, computing device 110 determines the encoding strategy based on the configuration data and the health state information.

In block 312, computing device 110 determines whether the configuration data indicates that the to-be-encoded data needs to be encoded on an entity other than computing device 110 such as entity 140 or entity 150 shown in FIG. 1. If the to-be-encoded data needs to be encoded on the entity other than computing device 110, then method 300 proceeds to block 306, otherwise, method 300 proceeds to block 314.

In block 314, computing device 110 encodes the to-be-encoded data thereon. It should be understood that method 300 is for the case where the encoding will be performed on one of computing device 110, entity 140, and entity 150. Therefore, when the configuration data indicates that the to-be-encoded data needs to be encoded on an entity other than computing device 110, the to-be-encoded data can be directly encoded on the entity, otherwise, the to-be-encoded data needs to be encoded on computing device 110.

Exemplary features of encoding environment 100 in which the device and/or the method according to an embodiment of the present disclosure may be implemented, encoding method 200 according to an embodiment of the present disclosure, and encoding method 300 according to an embodiment of the present disclosure are described above with reference to FIG. 1 to FIG. 3. It should be understood that the above description is to better demonstrate various aspects of illustrative embodiments of the present disclosure, and is not intended to limit the present disclosure in any way.

It should be understood that the numbers of various elements and the magnitudes of physical quantities used in the embodiments of the present disclosure and the drawings are only examples, and are not intended to limit the protection scope of the embodiments of the present disclosure. The above numbers and magnitudes can be arbitrarily set as needed without affecting the normal implementation of the embodiments of the present disclosure.

Through the above description with reference to FIG. 1 to FIG. 3, according to the technical solutions of the embodiments of the present disclosure, an encoding solution is provided, which is a comprehensive, user-oriented, and cluster-aware erasure code solution. Based on, for example, the configuration data provided by the user and the health state information of a cluster composed of the plurality of entities, the encoding strategy is intelligently determined and an erasure code codec is executed to encode the data. At the same time, the encoding solution can further help to enable the encoding solution to achieve more beneficial effects by providing corresponding user interfaces, sequence of strategies, and metadata management. In addition, the encoding solution can further ensure data availability and better performance by considering a state of resources, such as hardware resources, of the edge nodes and user preferences, thereby greatly improving the quality of data service for consumers in the edge network infrastructure. Specifically, the technical solutions according to the embodiments of the present disclosure have many advantages compared with conventional solutions.

For example, using the technical solution of the present disclosure, the user can define an encoding strategy by providing configuration data according to various granularity, from specific data to buckets or user units, so as to meet special requirements of users in ultra-large-scale edge storage systems. In such ultra-large-scale edge storage systems, large amounts of data from different third parties require adoption of different data protection strategies. Therefore, the technical solution of the present disclosure provides a high degree of flexibility in erasure code configuration in the case of edge networks.

For another example, by using the technical solution of the present disclosure, since the health state and the storage capacity of the entity set consisting of the plurality of entities are first considered in the encoding design, then the specific encoding strategy is set, balance may be achieved among the available hardware resources so as to ensure system performance under severe environments and user requirements for data availability. Even if the edge storage environment is uncontrollable, the technical solution of the present disclosure can still ensure the data availability. For another example, by using the technical solution of the present disclosure, metadata associated with the erasure codes is designed, which not only can contribute to the normal progress of encoding, but also can provide associated information for the purpose of user tracking and system data recovery.

In summary, by using the technical solution of the present disclosure, a comprehensive solution can be provided for the configuration and execution of erasure code redemption on the edge network system, so that the user interface for configuration can be designed as interaction between a physical server and a client for erasure code encoding execution, and the basic strategy for intelligent decision-making and corresponding metadata management to provide a unified architecture for edge network erasure code technology solutions.

Figure 4:
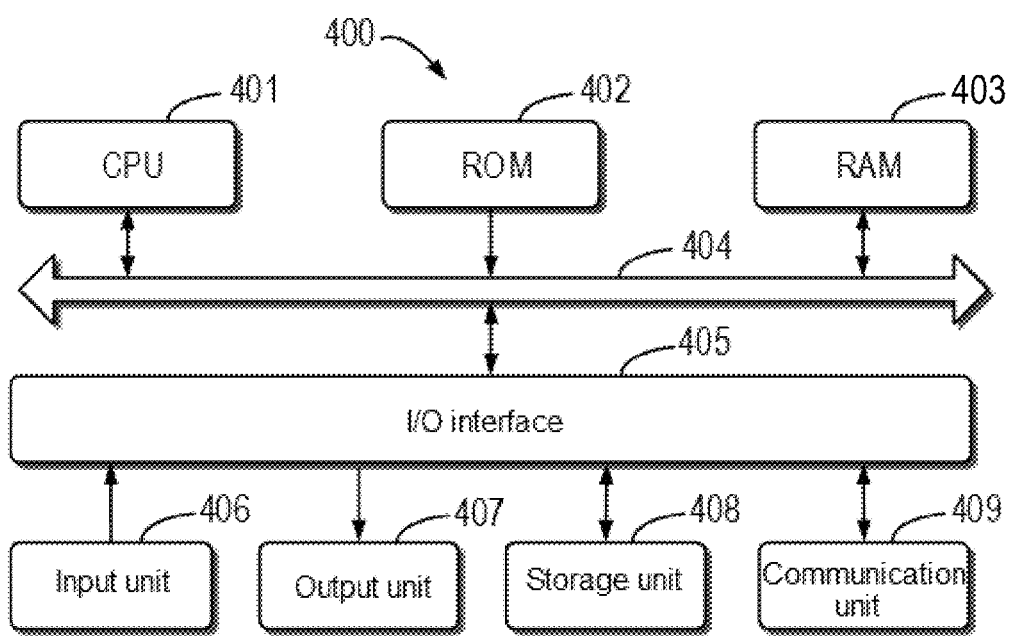
FIG. 4 illustrates a schematic block diagram of example device 400 that may be configured to implement an embodiment of the present disclosure.

FIG. 4 illustrates a schematic block diagram of example device 400 that may be configured to implement an embodiment of the present disclosure. According to an embodiment of the present disclosure, computing device 110 in FIG. 1 may be implemented by device 400. As shown in the figure, device 400 includes central processing unit (CPU) 401 that may execute various appropriate actions and processing according to computer program instructions stored in read-only memory (ROM) 402 or computer program instructions loaded from storage unit 408 to random access memory (RAM) 403. In RAM 403, various programs and data required for operating by device 400 may also be stored. CPU 401, ROM 402, and RAM 403 are connected to one another through bus 404. Input/output (I/O) interface 405 is also connected to bus 404.

A plurality of components in device 400 are connected to I/O interface 405, including: input unit 406, such as a keyboard and a mouse; output unit 407, such as various types of displays and speakers; storage unit 408, such as a magnetic disk and an optical disk; and communication unit 409, such as a network card, a modem, and a wireless communication transceiver. Communication unit 409 allows device 400 to exchange information/data with other devices over a computer network such as the Internet and/or various telecommunication networks.

The various processes and processing described above, such as methods 200 and 300, may be performed by CPU 401. For example, in some embodiments, methods 200 and 300 may be implemented as a computer software program that is tangibly included in a machine-readable medium such as storage unit 408. In some embodiments, part or all of the computer program may be loaded and/or mounted to device 400 via ROM 402 and/or communication unit 409. One or more actions of methods 200 and 300 described above may be executed when the computer program is loaded into RAM 403 and executed by CPU 401.

The embodiments of the present disclosure may relate to a method, a device, a system, and/or a computer program product. The computer program product may include a computer-readable storage medium on which the computer-readable program instructions for executing various aspects of the embodiments of the present disclosure are carried.

The computer-readable storage medium may be a tangible device that may hold and store instructions used by an instruction-executing device. For example, the computer-readable storage medium may be, but is not limited to, an electric storage device, a magnetic storage device, an optical storage device, an electromagnetic storage device, a semiconductor storage device, or any suitable combination of the foregoing. More specific examples (a non-exhaustive list) of the computer-readable storage medium include: a portable computer disk, a hard disk, a RAM, a ROM, an erasable programmable read-only memory (EPROM or flash memory), a static random access memory (SRAM), a portable compact disk read-only memory (CD-ROM), a digital versatile disk (DVD), a memory stick, a floppy disk, a mechanical encoding device such as a punch card or a raised structure in a groove having instructions stored thereon, and any suitable combination thereof. The computer-readable storage medium used herein is not to be interpreted as transient signals per se, such as radio waves or other freely propagating electromagnetic waves, electromagnetic waves propagating through waveguides or other transmission media (e.g., light pulses through fiber-optic cables), or electrical signals transmitted through electrical wires.

The computer-readable program instructions described herein can be downloaded from the computer-readable storage medium to various computing/processing devices, or downloaded to an external computer or external storage device via a network, such as the Internet, a local area network, a wide area network, and/or a wireless network. The network may include copper transmission cables, fiber optic transmission, wireless transmission, routers, firewalls, switches, gateway computers, and/or edge servers. A network adapter card or network interface in each computing/processing device receives the computer-readable program instructions from the network and forwards the computer-readable program instructions for storage in the computer-readable storage medium in each computing/processing device.

Computer program instructions for executing the operations of the embodiments of the present disclosure may be assembly instructions, instruction set architecture (ISA) instructions, machine instructions, machine-related instructions, microcode, firmware instructions, state setting data, or source code or object code written in any combination of one or more programming languages, wherein the programming languages include object-oriented programming languages, such as Smalltalk and C++, and conventional procedural programming languages, such as the C language or similar programming languages. The computer-readable program instructions may be executed entirely on a user's computer, partly on a user's computer, as a stand-alone software package, partly on a user's computer and partly on a remote computer, or entirely on a remote computer or a server. In a case where the remote computer is involved, the remote computer may be connected to the user's computer over any kind of networks, including the local area network (LAN) or the wide area network (WAN), or may be connected to the external computer, for example, connected through the Internet by using an Internet service provider. In some embodiments, an electronic circuit, for example, a programmable logic circuit, a field programmable gate array (FPGA), or a programmable logic array (PLA), is subjected to personalized customization by utilizing state information of the computer-readable program instructions, wherein the electronic circuit may execute the computer-readable program instructions so as to implement various aspects of the embodiments of the present disclosure.

The various aspects of the embodiments of the present disclosure are described here with reference to the flow charts and/or block diagrams of the methods, the devices/systems, and the computer program products according to the embodiments of the present disclosure. It should be understood that each block of the flow charts and/or the block diagrams and combinations of the blocks in the flow charts and/or the block diagrams may be implemented by the computer-readable program instructions.

These computer-readable program instructions may be provided to a processing unit of a general-purpose computer, a special-purpose computer, or a further programmable data processing apparatus, thereby producing a machine, such that these instructions, when executed by the processing unit of the computer or the further programmable data processing apparatus, produce an apparatus for implementing functions/actions specified in one or more blocks in the flow charts and/or the block diagrams. These computer-readable program instructions may also be stored in the computer-readable storage medium, and these instructions cause the computer, a programmable data processing apparatus, and/or other devices to operate in a specific mode; and thus the computer-readable medium having instructions stored includes an article of manufacture that includes instructions that implement various aspects of the functions/actions specified in one or more blocks in the flow charts and/or the block diagrams.

The computer-readable program instructions may also be loaded to the computer, a further programmable data processing apparatus, or a further device, so that a series of operating steps may be executed on the computer, the further programmable data processing apparatus, or the further device to produce a computer-implemented process, such that the instructions executed on the computer, the further programmable data processing apparatus, or the further device may implement the functions/actions specified in one or more blocks in the flow charts and/or the block diagrams.

The flow charts and the block diagrams in the drawings show the architectures, functions, and operations of possible implementation of the systems, the methods, and the computer program products according to various embodiments of the present disclosure. In this regard, each block in the flow charts or the block diagrams may represent a module, a program segment, or part of an instruction, wherein the module, the program segment, or part of the instruction include one or more executable instructions for implementing specified logical functions. In some alternative implementations, functions marked in the blocks may also occur in an order different from that marked in the accompanying drawings. For example, two successive blocks may actually be executed in parallel substantially, and sometimes they may also be executed in an inverse order, which depends on involved functions. It should be further noted that each block in the block diagrams and/or the flow charts as well as a combination of the blocks in the block diagrams and/or the flow charts may be implemented using a special hardware-based system that executes specified functions or actions, or using a combination of special hardware and computer instructions.

Various embodiments of the present disclosure have been described above. The foregoing description is illustrative rather than exhaustive, and is not limited to the disclosed embodiments. Numerous modifications and alterations are apparent to those of ordinary skill in the art without departing from the scope and spirit of the illustrated embodiments. The selection of terms as used herein is intended to best explain the principles and practical applications of the various embodiments or technical improvements to technologies in the market, and to otherwise enable persons of ordinary skill in the art to understand the embodiments disclosed here.

What is claimed is:

1. An encoding method, comprising:
   receiving configuration data related to encoding with a predetermined encoding mode;
   determining an encoding strategy based on the configuration data, wherein the encoding strategy comprises parameters associated with encoding the data on an entity; and
   causing the data to be encoded on the entity based on the encoding strategy;
   wherein the configuration data indicates information related to a plurality of data blocks and at least one corresponding check block to be encoded with the predetermined encoding mode, and the configuration data further indicates the entity; and
   wherein the entity comprises a portion of at least one computing device.

2. The method according to claim 1, wherein the parameters indicate at least one of the following:
   a source of the data,
   a type of the data,
   a protection priority of the data,
   the number of data blocks to be encoded with the predetermined encoding mode,
   the number of check blocks to be encoded with the predetermined encoding mode,
   a ratio associated with the number of the data blocks and the number of the check blocks,
   a type of encoding, and
   the entity.

3. The method according to claim 1, wherein determining the encoding strategy comprises:
   acquiring health state information of an available entity set that can be used to encode the data thereon, wherein the available entity set comprises the entity; and
   determining the encoding strategy based on the configuration data and the health state information.

4. The method according to claim 3, wherein the health state information indicates at least one of the following:
   environment information of an available entity in the available entity set;
   a health state associated with a computing unit in the available entity;
   a health state associated with a storage unit in the available entity;
   a utilization rate of the computing unit in the available entity; and
   a utilization rate of the storage unit in the available entity.

5. The method according to claim 1, wherein causing the data to be encoded on the entity based on the encoding strategy comprises:
   sending the encoding strategy to the entity.

6. The method according to claim 1, wherein causing the data to be encoded on the entity based on the encoding strategy comprises:
   causing the entity to obtain the data.

7. The method according to claim 1, further comprising:
   storing the parameters in a form of metadata.

8. The method according to claim 1, wherein the predetermined encoding mode indicates that an erasure code is adopted for encoding.

9. An electronic device, comprising:
   at least one processing unit; and
   at least one memory, coupled to the at least one processing unit and storing instructions for being executed by the at least one processing unit, wherein the instructions, when executed by the at least one processing unit, cause the electronic device to execute actions comprising:
   receiving configuration data related to encoding with a predetermined encoding mode;
   determining an encoding strategy based on the configuration data, wherein the encoding strategy comprises parameters associated with encoding the data on an entity; and
   causing the data to be encoded on the entity based on the encoding strategy;
   wherein the configuration data indicates information related to a plurality of data blocks and at least one corresponding check block to be encoded with the predetermined encoding mode, and the configuration data further indicates the entity; and
   wherein the entity comprises a portion of at least one computing device.

10. The electronic device according to claim 9, wherein the parameters indicate at least one of the following:
    a source of the data,
    a type of the data,
    a protection priority of the data,
    the number of data blocks to be encoded with the predetermined encoding mode,
    the number of check blocks to be encoded with the predetermined encoding mode,
    a ratio associated with the number of the data blocks and the number of the check blocks,
    a type of encoding, and
    the entity.

11. The electronic device according to claim 9, wherein determining the encoding strategy comprises:
    acquiring health state information of an available entity set that can be used to encode the data thereon, wherein the available entity set comprises the entity; and determining the encoding strategy based on the configuration data and the health state information.

12. The electronic device according to claim 11, wherein the health state information indicates at least one of the following:
    environment information of an available entity in the available entity set;
    a health state associated with a computing unit in the available entity;
    a health state associated with a storage unit in the available entity;
    a utilization rate of the computing unit in the available entity; and
    a utilization rate of the storage unit in the available entity.

13. The electronic device according to claim 9, wherein causing the data to be encoded on the entity based on the encoding strategy comprises:
    sending the encoding strategy to the entity.

14. The electronic device according to claim 9, wherein causing the data to be encoded on the entity based on the encoding strategy comprises:
    causing the entity to obtain the data.

15. The electronic device according to claim 9, wherein the actions further comprise:
    storing the parameters in a form of metadata.

16. The electronic device according to claim 9, wherein the predetermined encoding mode indicates that an erasure code is adopted for encoding.

17. A computer program product, tangibly stored in a non-transitory computer-readable medium and comprising machine-executable instructions, wherein the machine-executable instructions, when executed, cause a machine to execute steps of an encoding method, the encoding method comprising:
    receiving configuration data related to encoding with a predetermined encoding mode;
    determining an encoding strategy based on the configuration data, wherein the encoding strategy comprises parameters associated with encoding the data on an entity; and
    causing the data to be encoded on the entity based on the encoding strategy;
    wherein the configuration data indicates information related to a plurality of data blocks and at least one corresponding check block to be encoded with the predetermined encoding mode, and the configuration data further indicates the entity; and
    wherein the entity comprises a portion of at least one computing device.

18. The computer program product according to claim 17, wherein the parameters indicate at least one of the following:
    a source of the data,
    a type of the data,
    a protection priority of the data,
    the number of data blocks to be encoded with the predetermined encoding mode,
    the number of check blocks to be encoded with the predetermined encoding mode,
    a ratio associated with the number of the data blocks and the number of the check blocks,
    a type of encoding, and
    the entity.

19. The computer program product according to claim 17, wherein determining the encoding strategy comprises:
    acquiring health state information of an available entity set that can be used to encode the data thereon, wherein the available entity set comprises the entity; and
    determining the encoding strategy based on the configuration data and the health state information.

20. The computer program product according to claim 19, wherein the health state information indicates at least one of the following:
    environment information of an available entity in the available entity set;
    a health state associated with a computing unit in the available entity;
    a health state associated with a storage unit in the available entity;
    a utilization rate of the computing unit in the available entity; and
    a utilization rate of the storage unit in the available entity.

* * * * *